United States Patent [19]
Watanabe

[11] Patent Number: 5,925,926
[45] Date of Patent: *Jul. 20, 1999

[54] SEMICONDUCTOR DEVICE INCLUDING AN INNER LEAD REINFORCING PATTERN

[75] Inventor: Junichi Watanabe, Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/820,107

[22] Filed: Mar. 19, 1997

[51] Int. Cl.⁶ .................................................. H01L 23/495
[52] U.S. Cl. ............................................................ 257/668
[58] Field of Search ................................... 257/668, 666, 257/669, 676

[56] References Cited

U.S. PATENT DOCUMENTS

| | | | |
|---|---|---|---|
| 3,689,991 | 9/1972 | Aird | 257/668 |
| 5,243,141 | 9/1993 | Yonehara | 257/668 |

FOREIGN PATENT DOCUMENTS

| | | | |
|---|---|---|---|
| 1-155632 | 6/1989 | Japan | 257/668 |
| 1-187937 | 7/1989 | Japan | 257/668 |
| 3-72643 | 3/1991 | Japan | H01L 21/60 |

*Primary Examiner*—Olik Chaudhuri
*Attorney, Agent, or Firm*—Hayes, Soloway, Hennessey, Grossman & Hage, P.C.

[57] ABSTRACT

In a semiconductor device, inner lead reinforcing patterns are formed at an area on a TAB tape other than an area where the inner lead is formed, in the vicinity of a device hole of the TAB tape. The inner lead reinforcing patterns are bonded to inner lead reinforcing pattern pads provided on a semiconductor chip. Accordingly, the semiconductor chip is supported by both the inner leads and the inner lead reinforcing patterns such that stress applied to the inner leads from dead weight of the semiconductor chip and vibrations occurring during the fabrication process are reduced, and cutting and/or breaking of the inner leads can be prevented.

4 Claims, 3 Drawing Sheets ively and suitably determined based upon the area for wiring on the TAB tape 7, the weight of the semiconductor chip, etc. Further, the inner lead reinforcing patterns are

SEMICONDUCTOR DEVICE INCLUDING AN INNER LEAD REINFORCING PATTERN

BACKGROUND OF THE INVENTION

1. Field of the Invention

The present invention relates to a semiconductor device, and particularly to a TAB (Tape Automated Bonding) type semiconductor device.

2. Description of the Related Art

FIGS. 1 and 2 are diagrams showing the conventional bonding structure of a TAB tape and a semiconductor chip.

In the conventional bonding structure, shown in FIGS. 1 and 2, inner leads 4 formed on a TAB tape 7 are each bonded to an electrode pad portion of a semiconductor chip 3, and the semiconductor chip 3 is supported in a device hole 2 by only the inner leads 4. In the conventional bonding structure of the TAB tape 7 and the semiconductor chip 3 as described above, stresses are applied to the inner leads 4 due to the dead weight of the semiconductor 3 itself and vibrations occurring in the fabricating process, resulting in reduction in mechanical strength and finally in cutting of the inner leads 4. The pads of the semiconductor chip 3 tend to be arranged with a smaller interval, and this tendency of the pad arrangement also promotes reducing of the width of the inner lead 4 of the TAB tape 7. Therefore, it is expected that it will be difficult to support the semiconductor chip 3 by only the inner lead 4.

Furthermore, there has been proposed a semiconductor device in which support leads are bonded to empty electrode pads which are not required to be electrically connected, thereby enhancing the mechanical strength for supporting the semiconductor chip 3 (see Japanese Patent Application Laid-open No. Hei-3-72643, for example). In this system, the number of support leads is reduced when the number of empty pads is small, and thus this system is not so effective for enhancing mechanical support strength.

As described above, in the conventional bonding structure, the mechanical strength is increasingly reduced as stresses are applied to the inner leads, and finally the inner leads are cut or broken.

Furthermore, as described above, the interval of the pad arrangement on the semiconductor chip tends to be smaller, and thus the inner leads also tend to be narrower. However, the conventional bonding structure has not been able to follow this width-narrowing tendency.

SUMMARY OF THE INVENTION

An object of the present invention is to provide a semiconductor device which has high connection reliability and high mechanical strength for supporting a semiconductor chip and is able to follow the small interval pad arrangement tendency of the semiconductor device, and in which inner leads are prevented from being cut or broken.

In order to attain the above object, according to the present invention, there is provided a semiconductor device comprising a TAB tape having a device hole and a plurality of inner leads which are led into the device hole; a semiconductor chip having a plurality of inner lead pads connected to the plurality of inner leads by bonding and being supported in the device hole; an inner lead reinforcing pattern provided in an rea on the TAB tape other than an area where the plurality of inner leads are formed; and an inner lead reinforcing pattern pad provided on the semiconductor chip at a position corresponding to the inner lead reinforcing pattern, wherein the inner lead reinforcing pattern pad is connected to the inner lead reinforcing pattern by bonding.

The inner lead reinforcing patterns which are provided on the TAB tape are bonded to the inner lead reinforcing pattern pads on the semiconductor chip, and the semiconductor chip is supported by the inner leads and the inner lead reinforcing patterns. Therefore, the stress applied to the inner leads is reduced, and cutting of the inner leads is suppressed, so that a semiconductor device having high lead connection reliability can be achieved.

Further, the inner lead reinforcing pattern pads are provided on the semiconductor chip, and the inner lead reinforcing patterns on the TAB tape are bonded to the inner lead reinforcing pattern pads on the semiconductor chip, so that the inner leads can be reinforced irrespective of the number of empty electrode pads.

DETAILED DESCRIPTION OF THE PREFERRED EMBODIMENT

Figure 1:
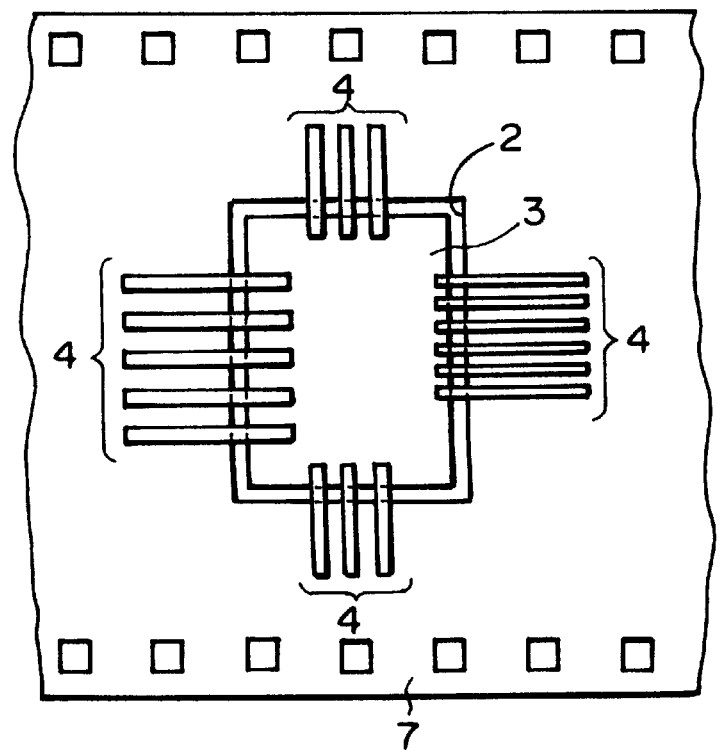
FIG. 1 is a plan view showing a conventional TAB type semiconductor device.
Figure 2:
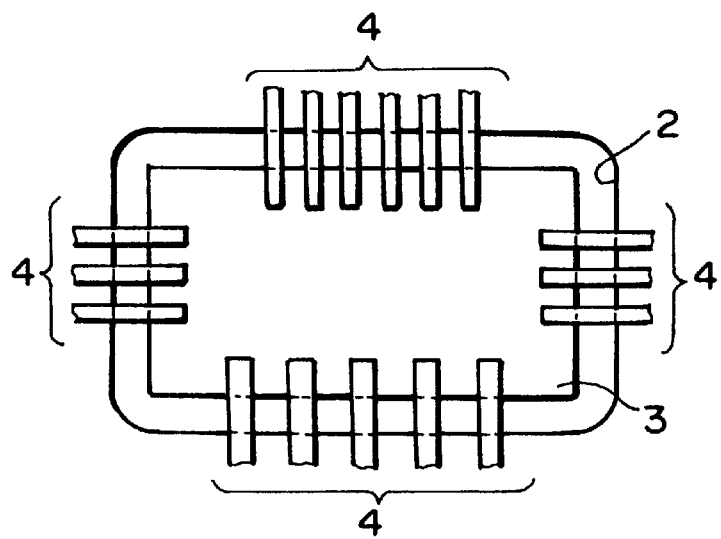
FIG. 2 is a partial enlarged plan view showing a support structure of a semiconductor chip shown in FIG. 1.
Figure 3:
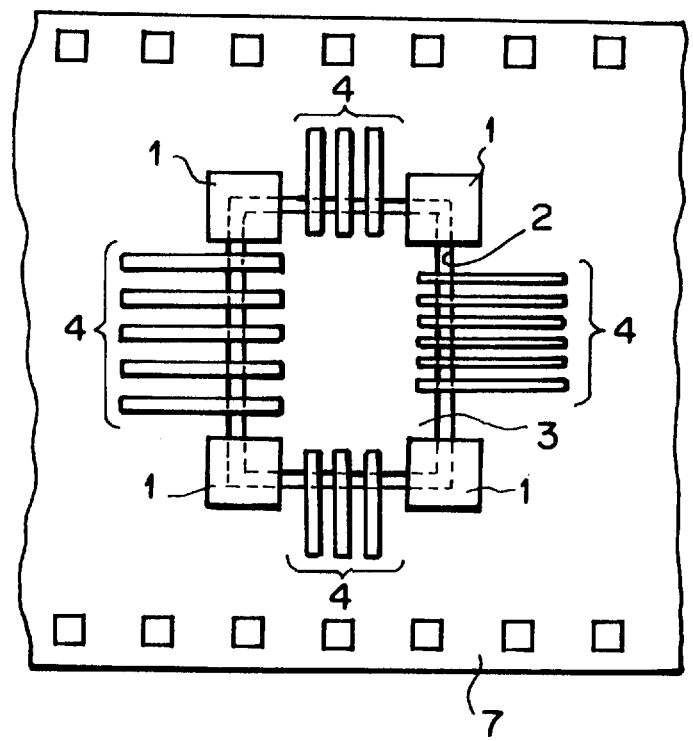
FIG. 3 is a plan view showing an embodiment of a TAB type semiconductor device according to the present invention.
Figure 4:
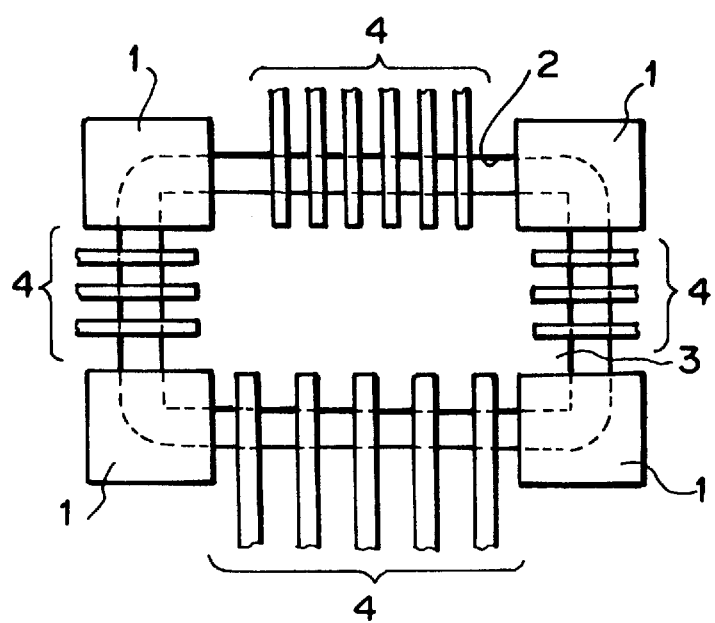
FIG. 4 is a partial enlarged plan view showing a support structure of the semiconductor chip shown in FIG. 3.
Figure 5:
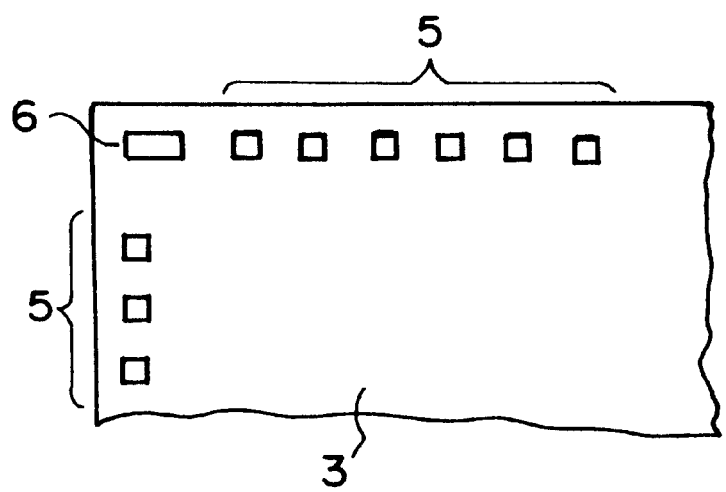
FIG. 5 is a partial enlarged plan view showing a corner portion of the semiconductor chip shown in FIG. 3.
Figure 6:
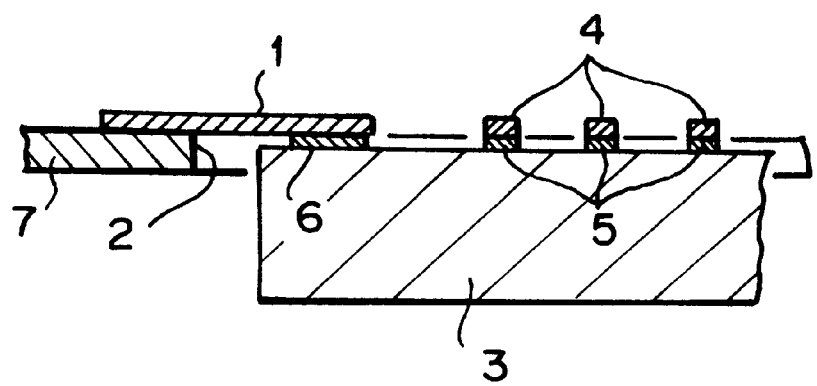
FIG. 6 is a partial cross-sectional view of FIG. 4.

FIG. 3 is a plan view showing an embodiment of a TAB type semiconductor device according to the present invention, FIG. 4 is a partial enlarged plan view showing a support structure for the semiconductor chip shown in FIG. 3, FIG. 5 is a partially enlarged plan view showing a corner portion of the semiconductor chip shown in FIG. 3, and FIG. 6 is a partial cross-sectional view of FIG. 4.

As show in FIGS. 3 and 4, in a TAB type semiconductor device according to an embodiment of the present invention, an inner lead reinforcing pattern 1 is formed at each of four corners of a device hole 2 of a TAB tape 7. Further, as shown in FIG. 5, electrode pads 5 (hereinafter referred to as "inner lead pads 5") are provided at the positions corresponding to the inner leads 4 on the four sides of the semiconductor chip 3 while pads 6 (hereinafter referred to as "inner lead reinforcing pattern pads 6"), which are exclusively used for being connected to the inner lead reinforcing patterns 1, are provided at the positions corresponding to the inner lead reinforcing patterns at the four corners of the semiconductor chip 3.

As shown in FIG. 6, the inner leads 4 and the inner lead pads 5 are bonded to each other, and the inner lead reinforcing patterns 1 and the inner lead reinforcing pattern pads 6 are bonded to each other, whereby the semiconductor chip 3 is supported by both the inner leads 4 on the four sides and the inner lead reinforcing patterns 1 at the four corners.

In this embodiment, the inner lead reinforcing patterns 1 each having a rectangular shape are provided at the four corners. However, the position, shape, and number of the inner lead reinforcing patterns 1 are not limited to those of the above-described embodiment, and they may be selectively and suitably determined based upon the area for wiring on the TAB tape 7, the weight of the semiconductor chip, etc. Further, the inner lead reinforcing patterns are formed of sheet metal which is the same material as the inner leads, and they are formed by a photo-etching method at the same time when the inner leads are formed.

What is claimed is:

1. A semiconductor device, comprising:
   a TAB tape having a device hole and a plurality of inner leads which are led into the device hole;
   a semiconductor chip having a plurality of inner lead pads electrically connected to the plurality of inner leads by bonding and supported in the device hole;
   an inner lead reinforcing pattern, electrically isolated from said plurality of inner leads, provided in an area on the TAB tape other than an area where the plurality of inner leads are formed; and
   an inner lead reinforcing pattern pad provided on the semiconductor chip at a position corresponding to the inner lead reinforcing pattern, wherein the inner lead reinforcing pattern pad is connected to the inner lead reinforcing pattern by bonding, said inner lead reinforcing pattern pad is exclusively for connection to the inner lead reinforcing pattern, and the inner lead reinforcing pattern is exclusively for connection to the inner lead reinforcing pattern pad and provides reinforced support of the chip, wherein said semiconductor chip and said device hole each have four corners, a respective inner lead reinforcing pattern pad is provided at each of the four corners of the semiconductor chip, and a respective inner lead reinforcing pattern is provided at each of the four corners of the device hole of the TAB tape.

2. A semiconductor device according to claim 1, wherein said semiconductor chip and said device hole are rectangular in plan.

3. A semiconductor device according to claim 1, wherein said inner lead reinforcing pattern pads are rectangular in shape.

4. A semiconductor device according to claim 1, wherein said inner lead reinforcing pattern pads and said inner lead pads are formed of the same material.

* * * * *